US006081033A

United States Patent [19]
Clampitt

[11] Patent Number: 6,081,033
[45] Date of Patent: *Jun. 27, 2000

[54] INTERCONNECTIONS FOR SEMICONDUCTOR CIRCUITS

[75] Inventor: Darwin A. Clampitt, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/901,924

[22] Filed: Jul. 29, 1997

[51] Int. Cl.[7] ............................ H01L 23/48; H01L 23/52; H01L 29/40
[52] U.S. Cl. ......................... 257/758; 257/750; 257/751; 257/752; 257/773
[58] Field of Search ..................................... 257/752, 758, 257/751, 773

[56] References Cited

U.S. PATENT DOCUMENTS

| | | | |
|---|---|---|---|
| 4,789,648 | 12/1988 | Chow et al. | 437/225 |
| 5,200,807 | 4/1993 | Eguchi | 257/758 |
| 5,341,026 | 8/1994 | Harada et al. | 257/764 |
| 5,380,679 | 1/1995 | Kano | 437/192 |
| 5,466,639 | 11/1995 | Ireland | 437/195 |
| 5,471,091 | 11/1995 | Pasch et al. | 257/752 |
| 5,471,093 | 11/1995 | Cheung | 257/758 |
| 5,602,423 | 2/1997 | Jain | 257/752 |
| 5,612,254 | 3/1997 | Mu et al. | 437/195 |
| 5,691,574 | 11/1997 | Suzuki | 257/758 |
| 5,932,928 | 8/1999 | Clampitt | 257/758 |

*Primary Examiner*—Teresa M. Arroyo
*Attorney, Agent, or Firm*—Killworth, Gottman, Hagan & Schaeff, L.L.P.

[57] ABSTRACT

Interconnections carrying the greatest currents within a semiconductor circuit are formed by an interconnect having at least one and commonly two or more ribs extending generally orthogonally from the interconnect line. The interconnect line is generally horizontal with the rib or ribs extending generally vertically downward from the interconnect line. The resulting interconnect occupies a surface area corresponding to that of the interconnect line yet includes the conductive material of both the interconnect line and the rib or ribs so that the interconnect has substantially less resistance than the interconnect line alone or the rib or ribs alone. The rib or ribs and interconnect line are produced from a conductive layer formed over an insulation layer after the insulation layer has been appropriately masked and etched. The rib or ribs can be formed over conductive plugs which are aligned with contact locations on a semiconductor structure and preformed through an insulation layer formed over the semiconductor structure. The rib or ribs and conductive plugs can also be formed together by forming a mask between two insulating layers to locate the conductive plugs. The top insulation layer is masked and etched to form trenches with openings through the bottom insulation layer being etched through the mask which prevents the bottom insulation layer from being etched other than to form openings for the conductive plugs. A layer of conductive material fills the conducive plug openings, corresponding openings in the mask and the trenches.

16 Claims, 4 Drawing Sheets

INTERCONNECTIONS FOR SEMICONDUCTOR CIRCUITS

BACKGROUND OF THE INVENTION

The present invention relates in general to interconnections within semiconductor circuits and methods of making the interconnections. More particularly, the present invention relates to interconnections which carry the greatest currents within the semiconductor circuits, referred to herein interchangeably as interconnects or large interconnects, and methods of making the interconnects to have low resistance and occupy reduced surface area. Since the large interconnects of the present application carry the greatest currents within the semiconductor circuits, they include, for example, power buses for conducting power within the semiconductor circuits.

A semiconductor circuit includes an array of devices which are interconnected by patterns of wiring lines formed of conductive material, some of the wiring lines connecting power to the devices. As the devices are scaled to smaller and smaller dimensions, formation of reliable interconnects becomes more and more difficult since the wiring lines need to be formed to occupy less chip space or surface area which is typically, at least in part, accomplished by reducing the width of the wiring lines. As the wiring lines are reduced in width, they eventually become so narrow that to reduce them further results in resistance levels which are too great for reliable operation of the semiconductor circuits. Resistance levels due to narrow wiring line widths is particularly problematic for power buses and other large interconnects which carry the highest currents within the semiconductor circuit.

To overcome the problems of further reduction of width for wiring lines, the depth of the lines has been increased. A method for increasing the depth of wiring lines is known as a damascene process which is named after the inlaid metal technique used in ancient Damascus to decorate swords and the like. In the damascene process, channels are etched into a generally planar insulation layer and a layer of conductive material is then formed over the insulation layer to fill the channels and form conductive ribs which are coupled to contact locations beneath the insulation layer. A planarization operation is then performed, for example by chemical mechanical planarization (CMP), to separate the inlaid ribs from one another.

Unfortunately, wiring lines used for large interconnects of a semiconductor circuit which are formed as ribs and produced, for example, by the damascene process, have height limitations such that the conductivity of the corresponding large interconnects is limited. Accordingly, this solution to the problem of providing ever smaller area wiring lines for interconnections is limited as well.

There is, thus, a need for improved interconnections for semiconductor circuits which will allow wiring lines to be formed within smaller surface areas yet provide lower resistances than can be produced by wiring lines formed as isolated conductive ribs.

SUMMARY OF THE INVENTION

This need is met by the methods and apparatus of the invention of the present application wherein interconnects associated with a semiconductor structure are formed by an interconnect line having at least one and commonly two or more ribs extending generally orthogonally from the interconnect line. In the illustrated embodiments of the interconnects, the interconnect line is generally horizontal and the associated rib or ribs extend generally vertically from the interconnect line. The resulting interconnect occupies a surface area corresponding to the surface area of the interconnect line yet includes the conductive material of the interconnect line and the rib or ribs which extend therefrom so that it has substantially less resistance than the interconnect line alone or the rib or ribs alone. The rib or ribs and interconnect line are produced from a conductive layer, with or without a barrier layer, formed over an insulation layer after the insulation layer has been appropriately masked and etched.

The ribs can be formed over conductive plugs which are preformed through an insulation layer formed over the semiconductor structure with the conductive plugs being aligned with contact locations on the semiconductor structure. The ribs and conductive plugs can also be formed together by forming a mask within an insulation layer or between two insulation layers to locate the conductive plugs. The upper insulation is masked and etched to form trenches with openings through the bottom insulation being etched through openings in the mask with the remainder of the mask preventing the bottom insulation from being etched other than to form openings for the conductive plugs. A layer of conductive material, with or without a barrier layer, is formed to fill the conducive plug openings, corresponding openings in the mask and the trenches.

It is, thus, an object of the present invention to produce semiconductor circuit interconnections which have low resistance relative to the surface area occupied by the interconnections; and, to produce semiconductor circuit interconnections having an interconnection line with at least one rib extending generally orthogonally from the interconnection line.

Other objects and advantages of the invention will be apparent from the following description, the accompanying drawings and the appended claims.

BRIEF DESCRIPTION OF THE DRAWINGS

FIG. 1 shows an isometric view of a portion of a semiconductor structure and a first insulation layer having conductive plugs extending therethrough;

FIG. 2 shows an isometric view of a second insulation layer formed over the structure of FIG. 1 with a series of trench openings extending through the second insulation layer;

FIG. 3 shows an isometric view of a barrier layer and a conductive layer formed over the structure of FIG. 2;

FIG. 4 shows an isometric view of the structure of FIG. 3 which has been masked and etched to form a conductive interconnect line covering and interconnecting ribs formed in the trench openings;

FIG. 5 shows an isometric view of a portion of a semiconductor structure, a first insulation layer and a patterned mask formed over the first insulation layer;

FIG. 6 shows an isometric view of a second insulation layer formed over the structure of FIG. 5 with a series of trench openings extending through the second insulation layer, the patterned mask and the first insulation layer;

FIG. 7 shows an isometric view of a barrier layer and a conductive layer formed over the structure of FIG. 6; and FIG. 8 shows an isometric view of the structure of FIG. 7 which has been masked and etched to form a conductive interconnect line covering and interconnecting ribs formed in the trench openings.

DETAILED DESCRIPTION OF THE INVENTION

Reference will now be made to FIGS. 1–4 which illustrate a first method of the present invention for forming large interconnects associated with a semiconductor structure 102 for forming a semiconductor circuit. The large interconnects carry the greatest currents within the semiconductor circuit and include, for example, power buses for conducting power within the semiconductor circuit. The interconnects are illustrated and will be described as being coupled to the semiconductor structure 102; however, the interconnects of the present application can be used wherever required within the structure of a semiconductor circuit.

The semiconductor structure 102 can be one or more semiconductor layers or other formations and can include active or operable portions of semiconductor devices. An insulation layer 104 or first insulation layer, for example an oxide such as phosphosilicate glass (PSG) or borophosphosilicate glass (BPSG), is formed over the semiconductor structure 102 which is silicon in the illustrated embodiment.

The insulation layer 104 is masked, for example by photo resist (not shown), to define contact locations 102C (only one shown) on the semiconductor structure 102 where contact openings 106 are to be formed. The insulation layer 104 is then etched to form the contact openings 106 which extend to the contact locations 102C of the semiconductor structure 102. The mask is removed and a layer of conductive material is formed over the insulation layer 104 to fill the contact openings 106A, 106B, 106C, 106D with the conductive material and thereby form filled conductive plugs 108. The structure is then planarized, for example by chemical mechanical polishing (CMP), to isolate the plugs 108 from one another so that they then individually extend through the insulation layer 104 to the contact locations 102C on the semiconductor structure 102 to which contact is to be made. The contact locations 102C may be for connecting power to the semiconductor structure 102 in which case the large interconnect would be a power bus for the semiconductor circuit.

Figure 1:
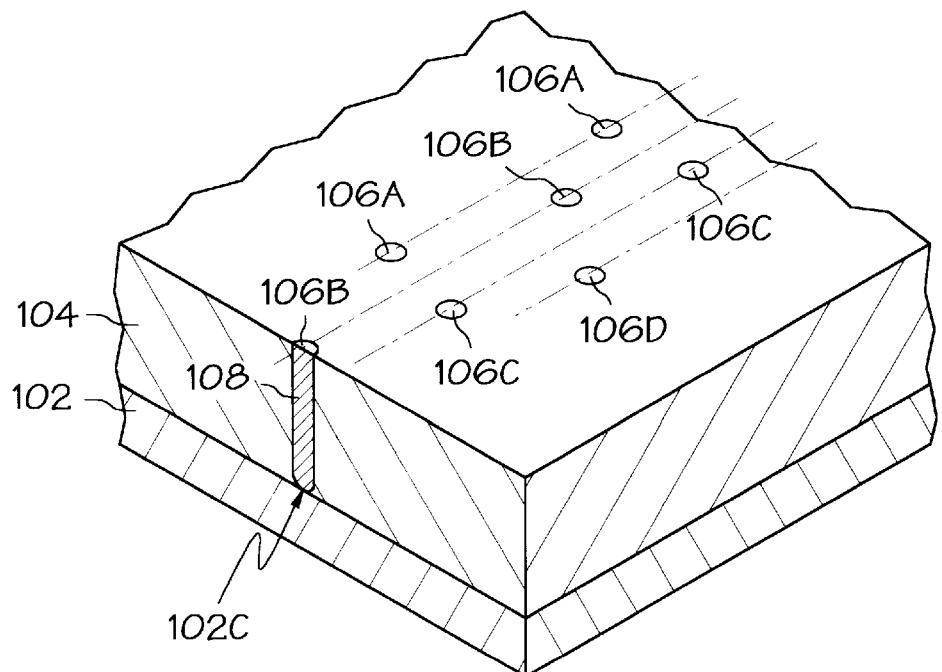
FIGS. 1–4 illustrate a first embodiment of the present invention for forming large interconnections associated with a semiconductor structure and, more particularly.
Figure 2:
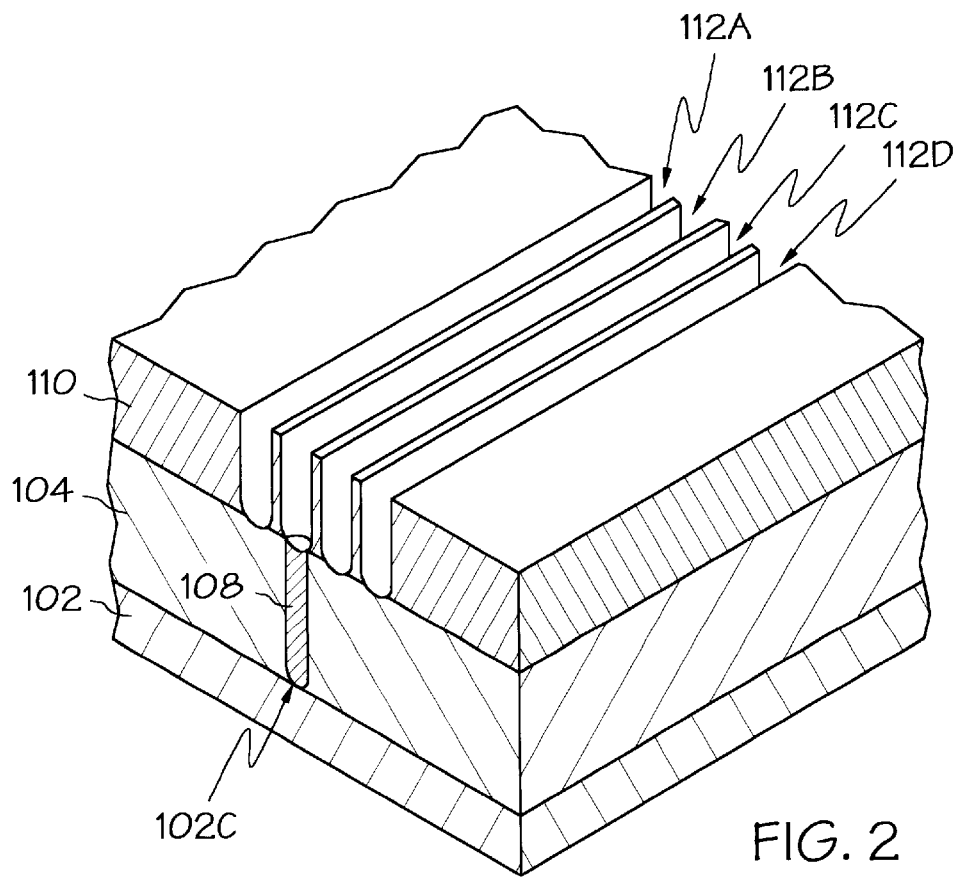
Figure 3:
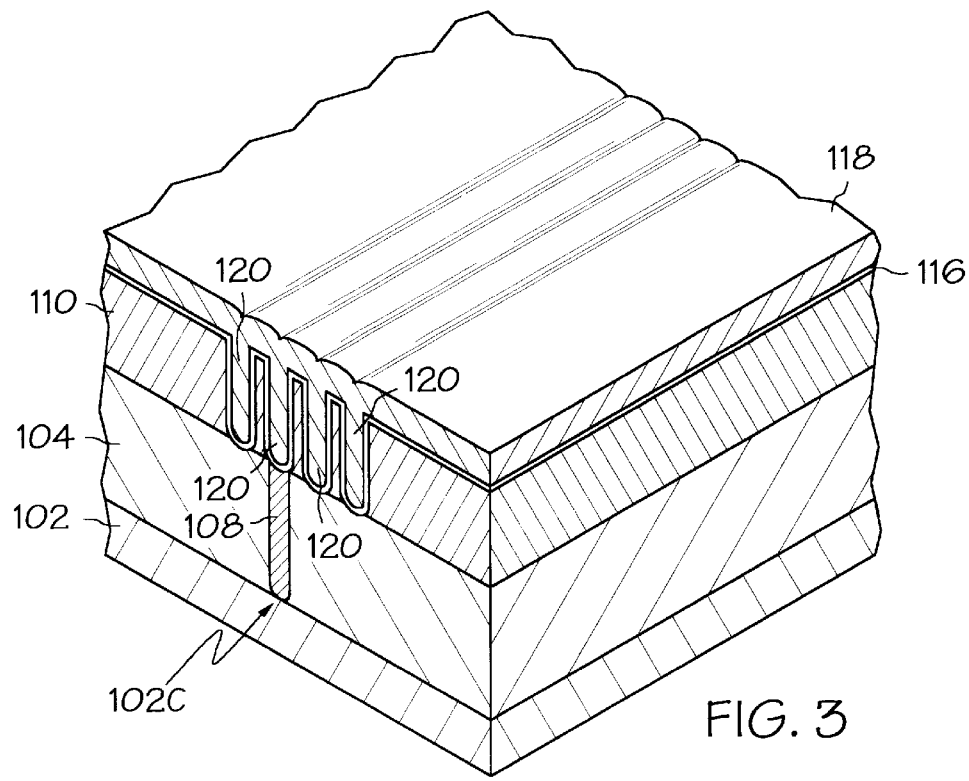
Figure 4:
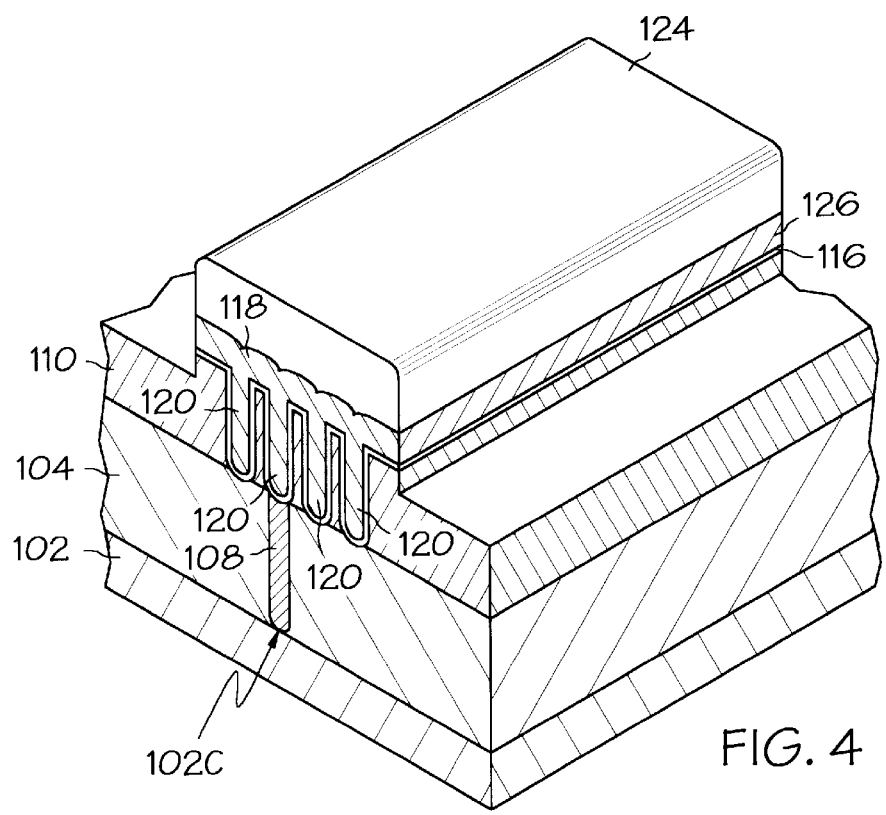

An insulation layer 110 or second insulation layer, for example an oxide such as tetraethyl orthosilicate (TEOS), is then formed over the insulation layer 104, see FIGS. 2–4. The insulation layer 110 is then masked, for example by photo resist, to form a patterned insulation layer having at least one open trench pattern, with at least two trench patterns typically being formed adjacent one another. The trench pattern or patterns are formed to align with the conductive plugs 108 and, thus, the contact locations 102C on the semiconductor structure 102. Four generally linear, parallel trench patterns are formed for the illustrated embodiment of FIGS. 1–4.

The patterned insulation layer is then etched to form at least one trench opening, four trench openings 112A, 112B, 112C, 112D in the embodiment shown in FIG. 2, with the trench openings 112A, 112B, 112C, 112D being closely adjacent one another, separated from one another, for example, by the feature size or minimum realizable process dimension of the process used to form the semiconductor circuit. As should be apparent, the trench opening 112A lines up with the contact openings 106A; the trench opening 112B lines up with the contact openings 106B; the trench opening 112C lines up with the contact openings 106C; and, the trench opening 112D lines up with the contact opening 106D.

If necessary, a barrier layer 116, such as titanium or tinitride, is formed in the trench openings 112A, 112B, 112C, 112D as shown in FIGS. 3 and 4. A conductive layer 118 is then formed over the barrier layer 116 to fill the trench openings 112A, 112B, 112C,112D. If the barrier layer 116 is not formed, the conductive layer 118 also fills the area illustrated as the barrier layer 116. The conductive layer 118 can be formed of chemical vapor deposition (CVD) tungsten, CVD copper, CVD aluminum or other appropriate deposited or sputtered conductive material as will be apparent to those skilled in the art. The conductive layer 118 fills the trench openings 112A, 112B, 112C, 112D to form conductive ribs 120 therein.

A pattern 124, for example of photo resist, is formed to define a conductive interconnect line 126 covering the conductive ribs 120 which are also interconnected by the conductive interconnect line 126. The portions of the conductive layer 118 not covered by the pattern 124 and corresponding portions of the barrier layer 116, if present, are etched to completely remove the conductive materials of the layers 118 and 116. Dependent upon the overall processing of the semiconductor structure 102, the etch may be performed to a level below the surface of the insulation layer 110. Etching into the insulation layer 110 would be performed, for example, if the large interconnects of the present application are formed at the same time as circuit interconnections described in pending patent application Ser. No. 08/887,801 by Clampitt filed Jul. 3,1997 and entitled SEMICONDUCTOR CIRCUIT INTERCONNECTIONS AND METHODS OF MAKING SUCH INTERCONNECTIONS which application is assigned to the same assignee as the present application and is incorporated herein by reference. The depth of the etching operation depends on the voltage levels used for a semiconductor circuit being produced, the feature size or minimum realizable process dimension, the materials being used to make the semiconductor circuit, and process variables such that it must be determined for each semiconductor circuit being produced.

The resulting improved interconnects of the present application are characterized by a conductive interconnect line which is connected to at least one conductive rib extending generally orthogonally from the interconnect line. As illustrated, the generally horizontal conductive interconnect line 126 extends over and interconnects the generally vertical conductive ribs 120. In this way, the large interconnect is only as wide as the interconnect line 126 but includes both the conductive material of the interconnect line 126 and the conductive material of the conductive ribs 120 so that the resistance of the interconnect is reduced. As illustrated, the conductive interconnect line 126 is above the conductive ribs 120; however, if a dual metallization process is used, a conductive interconnect line can be formed beneath the conductive ribs 120 in addition to or instead of the conductive interconnect line 126.

In the interconnects of the present application as illustrated in FIGS. 1–4, the ribs 120 and interconnect line 126 are linear which is appropriate for most portions of the interconnects in a semiconductor circuit. However, the interconnects of the present invention are generally applicable to a wide variety of semiconductor circuits wherein the ribs and interconnect lines are formed to define interconnect patterns for the corresponding semiconductor circuits and are not linear as illustrated.

A second method of the present invention for forming interconnects for a semiconductor structure 140 is illustrated in FIGS. 5–8. Here again, the semiconductor structure 140 can be one or more semiconductor layers or other formations and can include active or operable portions of semiconductor devices. An insulation layer 142 or first insulation layer, for example an oxide such as phosphosilicate glass (PSG) or borophosphosilicate glass (BPSG), is formed over the semiconductor structure 140 which is silicon in the illustrated embodiment.

Figure 5:
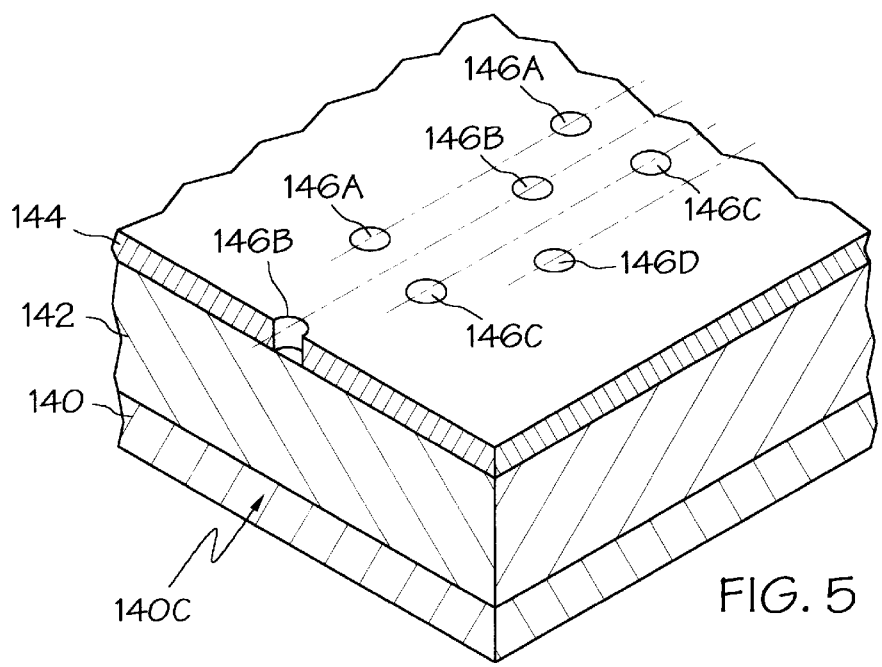
FIGS. 5–8 illustrate a second embodiment of the present invention for forming large interconnections for a semiconductor structure and, more particularly.

A silicon nitride layer 144 is formed over the insulation layer 142 and masked, for example by photo resist, to locate a plurality of openings 146A, 146B, 146C, 146D, see FIG. 5. An etch is then performed through the nitride layer 144 and slightly into the insulation layer 142 to form a patterned mask including the openings 146A, 146B, 146C, 146D which correspond to contact locations 140C (only one shown) of the semiconductor structure 140.

An insulation layer 148 or second insulation layer, for example an oxide such as tetraethyl orthosilicate (TEOS), is formed over the patterned mask formed by the nitride layer 144. A pattern, for example of photo resist (not shown), patterns at least one trench opening, with at least two trench openings typically being formed adjacent one another. The trench pattern or patterns are formed to align with the patterned mask openings 146A, 146B, 146C, 146D and, thus, the contact locations 140C on the semiconductor structure 140. Four generally linear, parallel trench patterns are formed for the illustrated embodiment.

Figure 6:
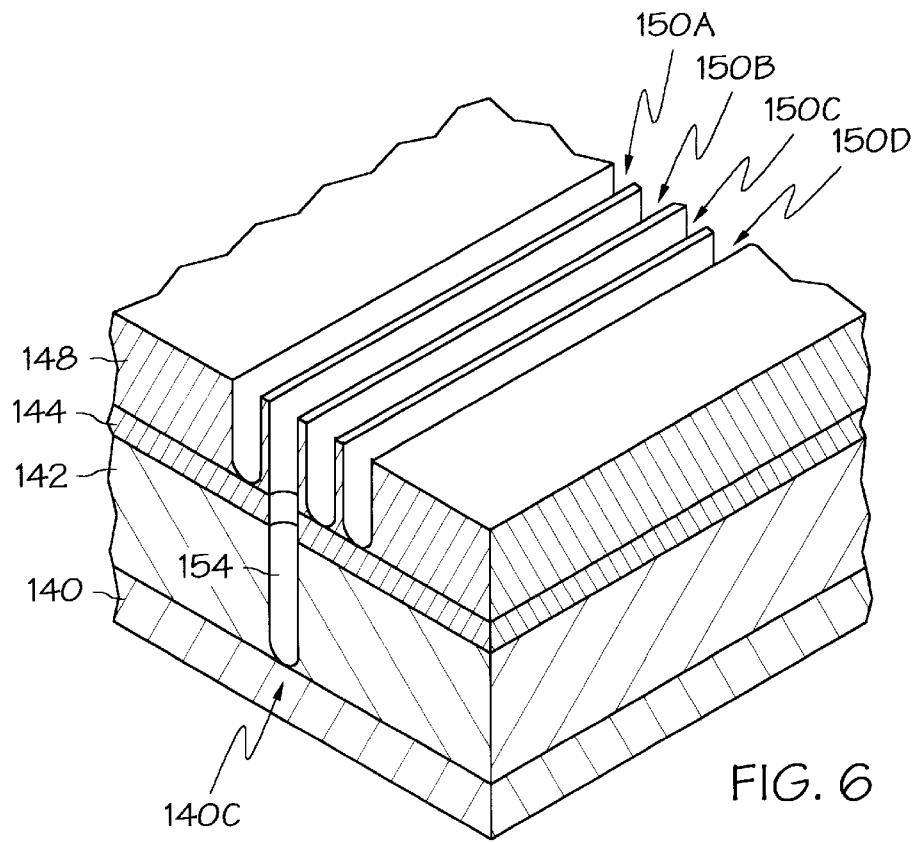
Figure 7:
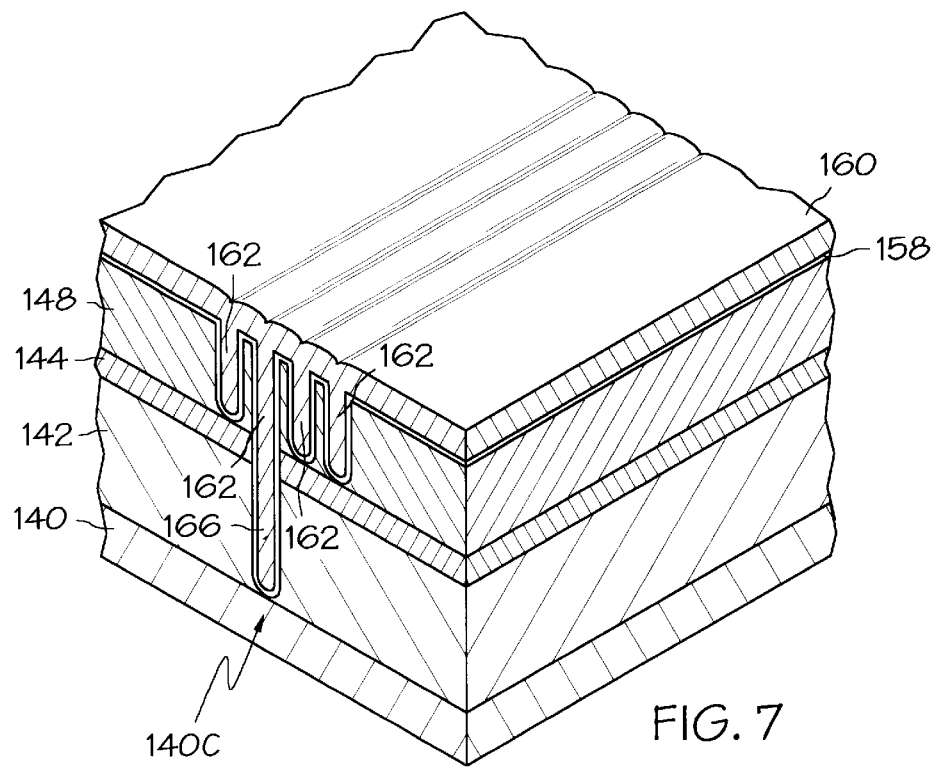
Figure 8:
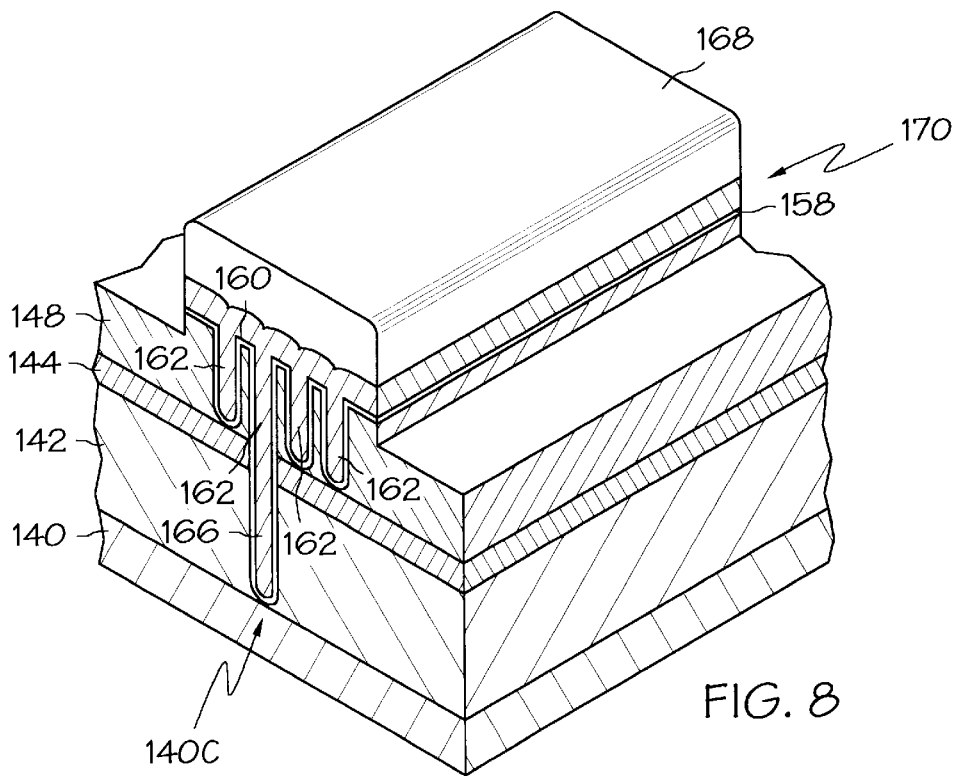

A highly selective etch is performed to form at least one trench, four trenches 150A, 150B, 150C, 150D in the embodiment shown in FIG. 6, with the trenches 150A, 150B, 150C, 150D being closely adjacent one another. As should be apparent, the trench 150A lines up with the pattern mask openings 146A; the trench 150B lines up with the pattern mask openings 146B; the trench 150C lines up with the pattern mask openings 146C; and, the trench 150D lines up with the pattern mask opening 146D. The etch stops on the nitride layer 144; however, where the nitride layer 144 was previously etched to form the openings 146A, 146B, 146C, 146D, the etch continues through the insulation layer 142 to form plug openings 154 (only one shown) to the contact locations 104C on the semiconductor structure 140. If necessary, a barrier layer 158, such as titanium or tinitride, is formed in the trench openings 150A, 150B, 150C, 150D, the openings 146A, 146B, 146C, 146D through the nitride layer 144 and the plug openings 154 as shown in FIGS. 7 and 8.

A conductive layer 160 is then formed over the barrier layer 158 to fill the trench openings 150A, 150B, 150C, 150D, the openings 146A, 146B, 146C, 146D through the nitride layer 144 and the plug openings 154. If the barrier layer 158 is not formed, the conductive layer 160 also fills the area illustrated as the barrier layer 160. The conductive layer 160 can be formed of CVD tungsten, CVD copper, CVD aluminum or other appropriate conductive material can be deposited or sputtered as will be apparent to those skilled in the art. The conductive layer 160 fills the trench openings 150A, 150B, 150C, 150D to form ribs 162 therein and fills the openings 146A, 146B, 146C, 146D and the plug openings 154 to form conductive plugs 166 (only one shown) therein.

A pattern 168, for example of photo resist, is formed to define a conductive interconnect line 170 with the interconnect line 170 covering and interconnecting the ribs 162. The portions of the conductive layer 160 not covered by the photo resist pattern 168 and corresponding portions of the barrier layer 158, if present, are etched to completely remove the conductive materials of the layers 160,158. As described above with regard to the embodiment of FIGS. 1–4, dependent upon the overall processing of the semiconductor structure 102, the etch may be performed to a level below the surface of the insulation layer 148.

The resulting improved interconnections produced by the second method of the present application again are characterized by a conductive interconnect line connected to at least one conductive rib extending generally orthogonally from the interconnect line. As illustrated, the generally horizontal conductive interconnect line 170 extends over and interconnects the generally vertical conductive ribs 162. In this way, the large interconnect is only as wide as the interconnect line 170 but includes both the conductive material of the interconnect line 170 and the conductive material of the conductive ribs 162 so that the resistance of the interconnect is reduced. As illustrated, the conductive interconnect line 170 is above the conductive ribs 162; however, if a dual metallization process is used, a conductive interconnect line can be formed beneath the conductive ribs 162 in addition to or instead of the conductive interconnect line 170.

As illustrated, the ribs 162 and the interconnect line 170 are linear which is appropriate for interconnections of most portions of a semiconductor circuit. However, the interconnects of the present invention are generally applicable to a wide variety of semiconductor circuits wherein the ribs and interconnect lines are formed to define interconnection patterns for the corresponding semiconductor circuits and are not linear as illustrated.

Having thus described the invention of the present application in detail and by reference to preferred embodiments thereof, it will be apparent that modifications and variations are possible without departing from the scope of the invention defined in the appended claims.

What is claimed is:

1. A semiconductor circuit comprising:

a semiconductor structure;

an insulation layer formed over said semiconductor structure;

at least one conductive rib extending through said insulation layer and coupled to at least one contact location on said semiconductor structure, said at least one conductive rib being substantially continuous along its entire length; and a conductive contact line extending over said at least one conductive rib and being substantially coextensive in length therewith.

2. A semiconductor circuit as claimed in claim 1 wherein said at least one conductive rib is coupled to said at least one contact location on said semiconductor structure through a barrier layer.

3. A semiconductor circuit comprising:

a semiconductor structure;

a first insulation layer formed over said semiconductor layer;

conductive plugs extending through said first insulation layer and corresponding to contact locations on said semiconductor structure;

a second insulation layer formed over said first insulation layer;

a plurality of conductive ribs extending through said second insulation layer and coupled to said conductive plugs, said plurality of conductive ribs being substantially continuous along their entire length; and a conductive contact line extending over said second insulation layer and interconnecting said plurality of conductive ribs, said conductive contact line being substantially coextensive in length with said plurality of conductive ribs.

4. A semiconductor circuit as claimed in claim 3 wherein said conductive ribs are coupled to said conductive plugs through a barrier layer.

5. A semiconductor circuit as claimed in claim 3 wherein at least two of said plurality of conductive ribs are substantially parallel to one another.

6. A semiconductor circuit as claimed in claim 5 wherein each of said plurality of conductive ribs are substantially parallel to one another.

7. A semiconductor circuit comprising:

a semiconductor structure;

an insulation layer formed over said semiconductor structure;

a plurality of conductive plugs extending from contact locations on said semiconductor structure into said insulation layer;

at least one conductive rib extending from said conductive plugs to an outer surface of said insulation layer, said at least one conductive rib being substantially continuous alone its entire length; and a conductive contact line on said outer surface of said insulation layer connected to said at least one conductive rib and being substantially coextensive in length therewith.

8. A semiconductor circuit as claimed in claim 7 wherein said contact locations on said semiconductor structure comprise power contact locations on said semiconductor structure.

9. A semiconductor circuit as claimed in claim 7 further comprising a patterned mask embedded within said insulation layer.

10. A semiconductor circuit as claimed in claim 9 wherein said insulation layer is oxide and said patterned mask is nitride.

11. A semiconductor circuit comprising:

a semiconductor structure; and a power bus comprising:

at least one generally vertical conductive rib coupled to at least one power contact location of said semiconductor structure, said at least one generally vertical conductive rib being substantially continuous along its entire length; and a generally horizontal conductive contact line extending over and connected to said at least one generally vertical conductive rib and being substantially coextensive in length therewith.

12. An interconnect for a semiconductor circuit including a semiconductor structure, said interconnect comprising:

a conductive contact line; and at least one conductive rib connected to and extending from said contact line and being coupled to at least one contact location of said semiconductor structure, said at least one conductive rib being substantially continuous along its entire length and being substantially coextensive in length with said conductive contact line.

13. An interconnect as claimed in claim 12 wherein said at least one contact location comprises at least one power contact location.

14. An interconnect for a semiconductor circuit including a semiconductor structure, said interconnect comprising:

a conductive contact line; and a plurality of conductive ribs and connected to and extending from said power contact line, said plurality of conductive ribs being substantially continuous along their entire length and substantially coextensive in length with said conductive contact line.

15. An interconnect as claimed in claim 14 wherein at least two of said plurality of conductive ribs are substantially parallel to one another.

16. An interconnect as claimed in claim 15 wherein each of said plurality of conductive ribs are substantially parallel to one another.

* * * * *